United States Patent [19]

Ely et al.

[11] Patent Number: 4,480,182

[45] Date of Patent: Oct. 30, 1984

[54] SINGLE PLANE OPTICAL MEMBRANE SWITCH AND KEYBOARD

[75] Inventors: Richard I. Ely; Carl E. Mosier, both of Orange Park, Fla.

[73] Assignee: Burroughs Corporation, Detroit, Mich.

[21] Appl. No.: 358,822

[22] Filed: Mar. 16, 1982

[51] Int. Cl.³ .............................................. G02B 5/14
[52] U.S. Cl. .................................. 250/227; 250/229; 340/365 P
[58] Field of Search ....................... 250/216, 227, 229; 350/96.15, 96.16, 96.18; 340/365 P; 73/705; 400/474, 479, 479.2; 178/170

[56] References Cited

U.S. PATENT DOCUMENTS

| | | | |
|---|---|---|---|
| 3,519,116 | 7/1970 | Koehn | 340/365 P |
| 3,558,213 | 1/1971 | Marcatili | 350/96.12 |
| 3,673,327 | 6/1972 | Johnson et al. | 340/365 P |
| 4,116,531 | 9/1978 | Greenwood | 340/365 P |
| 4,254,333 | 3/1981 | Bergström | 250/227 |

OTHER PUBLICATIONS

*Fiber Optic Keyboard or Data Entry Device*, by R. Harris, IBM Tech. Disc. Bull., vol. 23, No. 2, Jul. 1980, pp. 721-722.

*Primary Examiner*—David C. Nelms
*Attorney, Agent, or Firm*—Carl Fissell, Jr.; Edmund M. Chung; Kevin R. Paterson

[57] ABSTRACT

Photo-optical switch apparatus useful for example in keyboard switches includes a photopolymerized orthogonal matrix of horizontal and vertical intersecting light channels or guides, monolithically formed by exposure to ultraviolet light on a flat planar, plastic substrate. Each intersection has a refractive index higher than either the channel or the adjacent substrate area. A curved tap or light coupler couples the horizontal to the vertical channel of the array. The intersections of the channels are disposed over an array of upstanding projections on a flat mounting substrate with each projection located at a respective intersection of the horizontal and vertical light channel. A light absorbing key pad is arranged adjacent to each intersection to couple light from the channel up into the key pad. A relative loss of light indicates the key being depressed.

7 Claims, 7 Drawing Figures

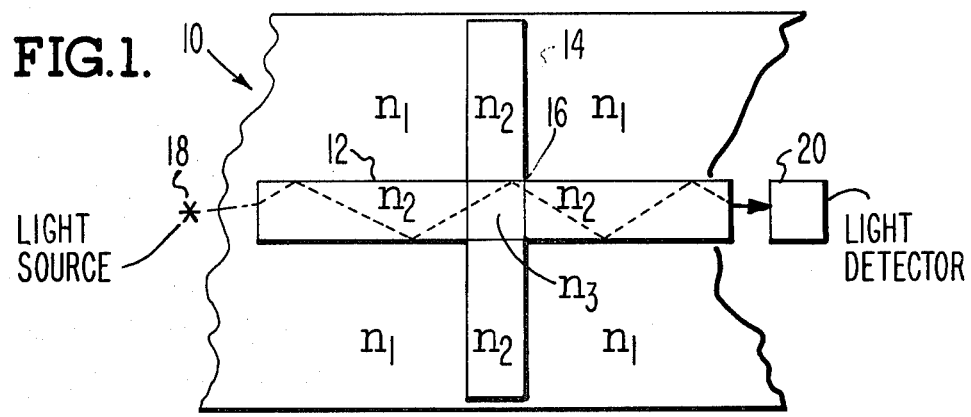
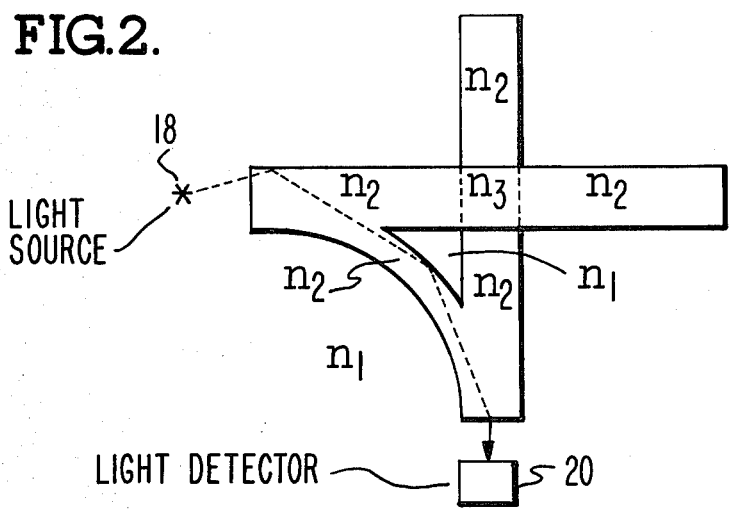
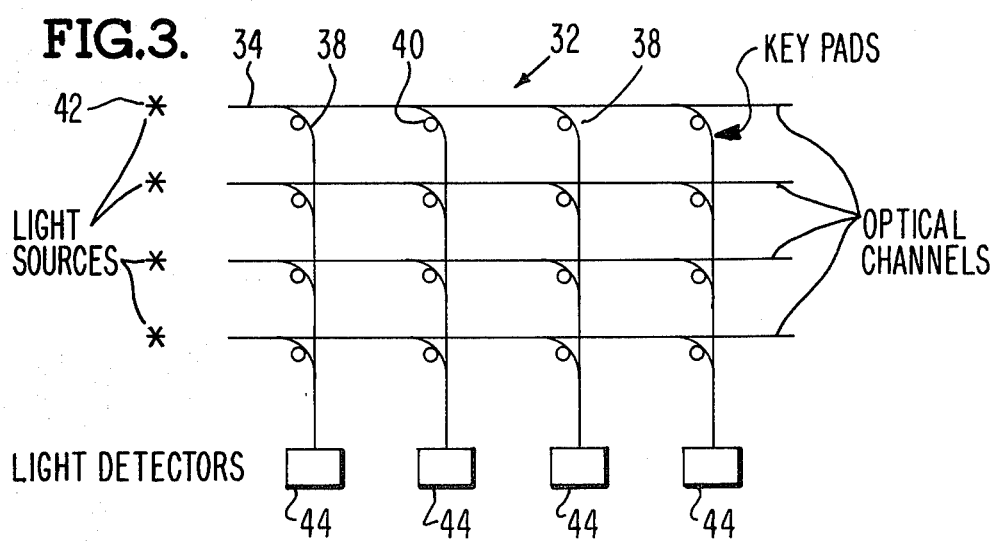

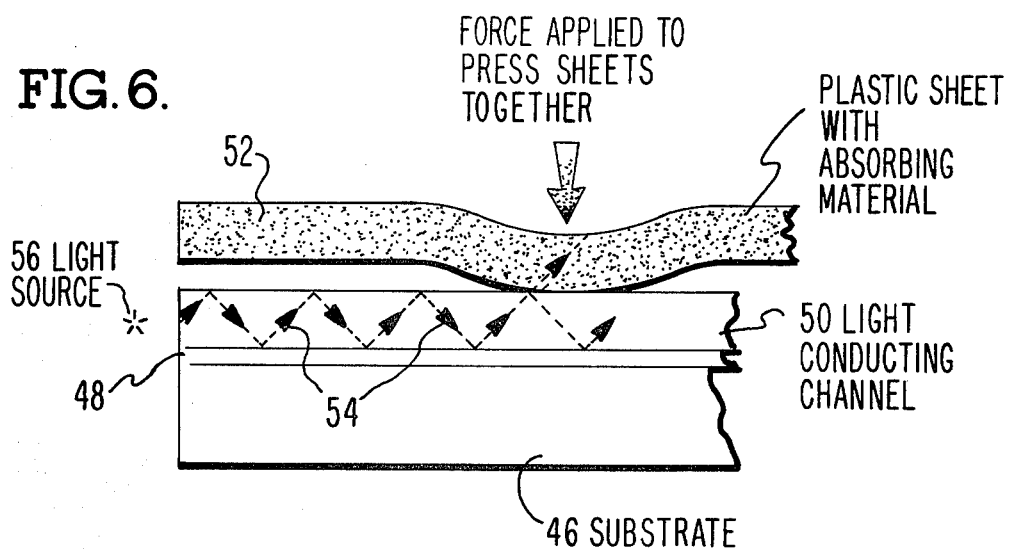
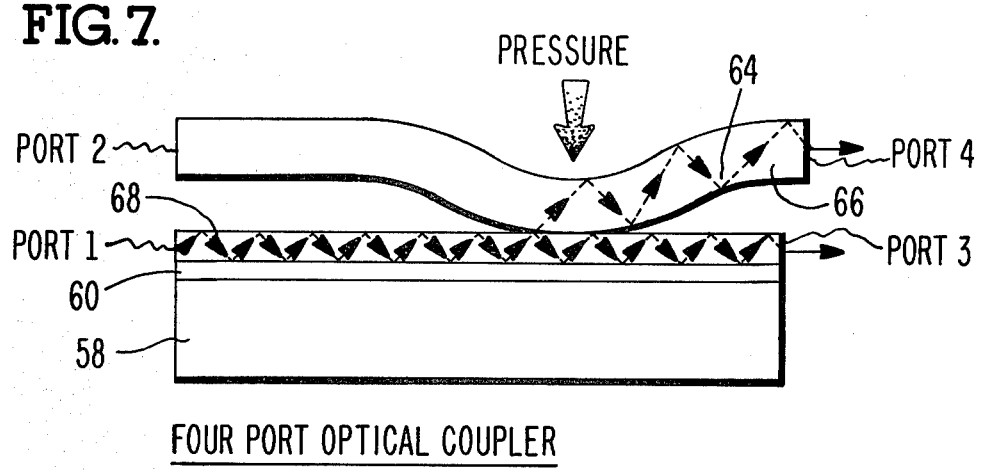

SINGLE PLANE OPTICAL MEMBRANE SWITCH AND KEYBOARD

CROSS REFERENCE TO RELATED APPLICATIONS

The present application is related to the following listed applications dealing with related subject matter all assigned to the same assignee as the present application and file concurrently herewith.

"FIBER WRAP KEYBOARD AND SWITCH", U.S. Ser. No. 358,825 filed Mar. 16, 1982 in the names of Richard I. Ely, Carl E. Mosier and James E. Andree;

"MULTI-PLANE OPTICAL MEMBRANE SWITCH APPARATUS", U.S. Ser. No. 358,823, filed Mar. 16, 1982, in the names of Richard I. Ely and Wunnava V. Subbarao;

"MOLDED OPTICAL KEYBOARD HAVING FIBER OPTIC KEYS", U.S. Ser. No. 358,826, filed Mar. 16, 1982, in the names of Wunnava V. Subbarao, Richard I. Ely and Carl E. Mosier;

"MOLDED OPTICAL WAVEGUIDE SWITCHING APPARATUS", U.S. Ser. No. 358,824, filed Mar. 16, 1982, in the name of Richard I. Ely.

BACKGROUND OF THE INVENTION

1. Field of the invention

The invention relates to photo-optical switches and keyboards and more particularly to single plane or monolithic photo-optical switch and keyboard apparatus.

2. Description of the Prior Art

Prior art electrical membrane switches have an electrically conductive coating on one side of each of two facing membranes which are normally separated but which may be brought into momentary contact as by operator finger pressure. When the two membranes are pressed together electrical contact is made between the two conductive surfaces or coatings. These conductive coatings have the disadvantage that they tend to radiate electromagnetic energy and are susceptible to electromagnetic interference (EMI).

It is therefore an object of the present invention to provide a photo-optical switch mechanism which avoids these problems while providing an efficient, fast acting, easily constructed fabricated and assembled switch assembly for use in keyboard arrays.

Still another object of the present invention is to provide a photo-optical switch mechanism which overcomes the EMI problems without measurably adding to the cost of construction and fabrication of the switching device.

SUMMARY OF THE INVENTION

Optically conducting membrane channels or light guides are photographically produced on a flat, planar, plastic substrate by utilizing a mask having row and column light guides outlined therein. The substrate is exposed through the mask by means of ultraviolet light. First a horizontal row is exposed and then the mask is rotated to expose a series of vertical columns. Where the ultraviolet light exposes the guide areas under the mask a higher index of refraction than the base substrate is produced. In the region where the two channels or guides intersect a double exposure to the ultraviolet light produces an even higher index of refraction. The result is an optical film with three areas with different indices of refraction with the relationship $N_3$ is greater than $N_2$ is greater than $N_1$ i.e. of the substrate, light guides and the intersections, respectively. Light generators are located at the horizontal guide ends (x) while photo receptors are located at the vertical column ends (y). Light is coupled from the source of light into the channel with the index $N_2$. Only light that hits the $N_2$ minus $N_1$ interface at a low angle will be totally reflected. When the light strikes the region with index $N_3$ it will pass into this channel because it hits the interface at a large angle. However, when the light hits the side of the region it will again be totally reflected because $N_3$ is greater than $N_2$ and the light hits the boundary at a low angle. Thus there is not light leakage from one channel to another.

For optical switching, light is selectively coupled from one channel to another by means of a curved tap or guide. The "tap" light guide is produced in the same manner as the row and column guides were produced in accordance with the suggestions hereinabove. Switching action is produced by pressing a material with an index of $N_2$ or greater onto the tap channel in optical contact therewith. Light then couples up into the material effectively reducing the amount of light coupled from one channel to another. This reduction in light output can be detected by the light receptor or detector disposed at the end of the column light guides. By arranging the tap covers, light absorbers and key pads at the intersections between the x rows and y columns an optical keyboard is formed. The light sources are then multiplexed which reduces the total number of light sources required.

BRIEF DESCRIPTION OF THE DRAWINGS

FIG. 1 is a schematic top plan view (not to scale) of an x-y intersecting set of light guides with refractive indices specified;

FIG. 2 is a view similar to FIG. 1 illustrating the "tap" connecting the x-y light guides;

FIG. 3 is a schematic illustration of a photo-optical switch matrix including the taps and key pads effectively forming a key switch array for a keyboard;

FIG. 6 is a side elevational view illustrating a further implementating modification of the structure of FIGS. 1 and 2; and FIG. 7 is a view similar to FIG. 6 showing a still further modification of the structure of FIG. 6.

DESCRIPTION OF THE PREFERRED EMBODIMENT

Figure 4:
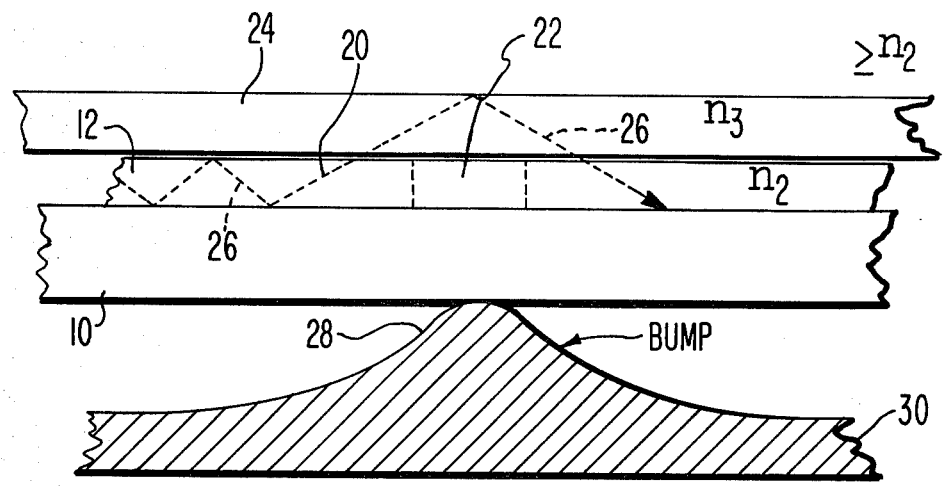
FIG. 4 is a greatly enlarged (not to scale) schematic illustration of a key switch in accordance with the present invention shown in the inoperative position.

The present invention employs optically conductive membrane channels which are produced on a flat monolithic substrate, as described in an article entitled, "OPTICAL WAVE GUIDING INTERSECTIONS WITHOUT LIGHT LEAK", which appeared in April 1977 issue of the magazine APPLIED OPTICS at pages 1033-1037; authored by Takashi Kurokawa and Shigeru Oikawa. The structural combination resulting from the techniques therein described are illustrated in FIGS. 1 and 2 of the drawings.

Briefly, photographic techniques are utilized so as to produce individual wave guides or light channels. A plastic film or substrate 10 containing a monomer with higher refractive index is selectively exposed by ultraviolet light (uv) through a pattern mask, for example, so that a monomer in the exposed part is photo-polymerized. After removal of the unpolymerized monomer the refractive index of the exposed part becomes higher $N_2$ than the refractive index of the surrounding areas of the film 10 $N_1$, resulting in individual photo-optical channels or light guides. By rotating the mask it was possible to first form horizontal x row channels 12 and thereafter vertically y column channels 14. In the region 16 where the channels 12 and 14 overlap i.e. cross over one another, a double exposure with ultraviolet light resulted in a refractive index of $N_3$, at the cross over point. The combination of film channels produces the relationship $N_3$ is greater than $N_2$ is greater than $N_1$ with three different areas. It should be noted that if the region of the intersection of channels 12 and 14 were not double exposed to ultraviolet light there would be coupling between the wave guides 12 and 14 as shown in FIG. 1.

Light emitted from a light source 18 is coupled into the x row wave guide with an index $N_2$. Only light that hits the $N_2$ minus $N_1$ interface at a low angle will be totally reflected. When the light hits the region of the overlap with the index of $N_3$ the light will pass up into the $N_3$ region because it strikes the interface at a large angle. However, when it hits the side of the region it will again be totally reflected because $N_3$ is greater than $N_2$ and the light hits the boundary at a low angle. This technique also assures that there will be no light leakage from one channel to another.

In order to provide an optical switch it is necessary to selectively couple light from one channel to another i.e. from an x row channel source 18 to a y column channel light receptor 20. As seen in FIG. 2 this can be accomplished by means of a tap or cross over coupler 22. As seen in FIG. 2 the tap 22 is gently curved and is the only means by which light can get from one channel to another in the device.

Figure 5:
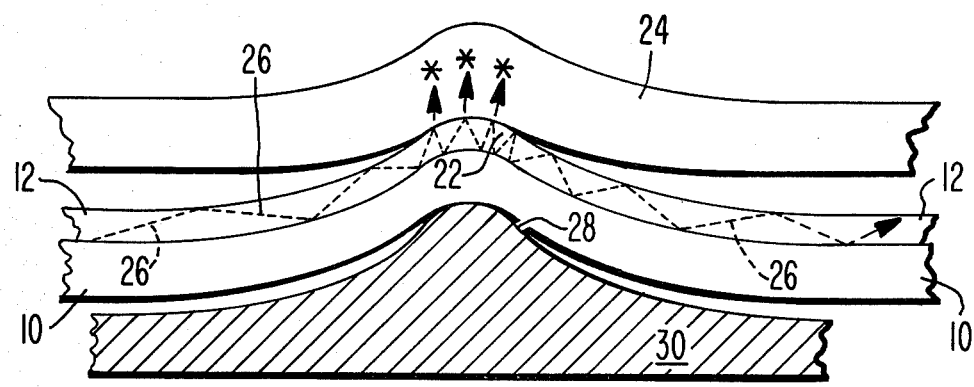
FIG. 5 is a view similar to FIG. 4 but illustrating the optical break in the wave guide provided by the "cross over bumps"

For the present device to work as a true switch, means must be provided to "make and break" the light beam path or circuit. Since the present device is a photo-optical coupling and not an electrical connection only the light passage is considered. Here light is either passed or blocked. Switching action is provided, as seen in FIGS. 4 and 5, by pressing another material 24 of an index $N_2$ or greater onto or against the tap 22. Light will then couple up into the material 24 to reduce the amount of light coupled from one channel to the other. This reduction in the light output can be detected by the light sensor or receptor 20 arranged at the y column ends of the wave guide 14 as in FIG. 2.

As seen by reference to FIG. 4 of the drawings, the mere contact of light absorbing material 24 against the tap area 22 is insufficient to cause the light 26 to couple up into the material 24 so as to be absorbed thereby to a sufficient extent to produce a detectable light reduction indicating switch closure. However, by providing a matrix of upstanding projections or bumps 28 on a bottom mounting plate 30 as shown in FIG. 5 at intersection points between row and column wave guides 12 and 14 a series of sharp curves are produced which in turn act to deflect the light 26 passing along a respective wave guide, as shown most clearly in this figure. The resulting "break" in the wave guides destroys the transmissivity of the fiber at this point and introduces a high light loss in the area in the wave guide as a direct result of the bump or projection 28. The light 26 is thus effectively absorbed by the material 24 e.g. black plastic or sponge rubber to an extent producing a detectable light loss at the photo receptor 20.

Referring to FIG. 3 there is shown schematically a keyboard matrix 32 produced by the photo-polymerization technique setforth hereinbefore and providing an area array of horizontal x row wave guides or light channels 34 intersected by verticaly column wave guides or light channels 36. Taps or couplers 38 are provided at each intersection and a key pad 40 is applied to each tap 38 in accordance with the earlier described construction technique. Light source 42 are arranged at the entering end of each horizontal wave guide or light channel 34 while a photo receptor or light detector 44 is disposed at the exiting or terminating end of each vertical column light channel 36. The light sources 42 are multiplexed so as to reduce the total number of light sources required by the device.

Finger pressure by an operator of any key pad 40 causes the tap 38 to be deflected downwardly to bring the two intersecting channels together over a respective projection 28 (FIGS. 4 and 5) effectively absorbing the light and indicating the precise key which has been activated by the operator.

When plastic material, such for example, as plexiglass (Rohm and Haas Co. Philadelphia, Pa.) is put under stress, bireference is induced therein, i.e. a change in the index or refraction in one direction. This change can be sufficiently large so as to act in the nature of a switch.

It is known, that when a light conducting layer is disposed on a rigid substrate and is provided with a plastic coating, the index of refraction of the coating is lower than that of the substrate. Under a "no pressure" condition, light will be totally internally reflected within the substrate. When "pressure" is applied, making the index of refraction of the conducting layer higher than that of the substrate, light is coupled up into the coating or film.

A modification of the aforedescribed technique (in connection with FIGS. 1–5) has been successfully employed to produce an optical film switch, as will now be described.

Referring to FIG. 6 there is shown a substrate 46 on which a plastic coating 48 is disposed providing a light conducting channel 50. A light absorbing plastic sheet 52 (or a plastic sheet filled with light absorbing particles) with an index or refraction of sheet 52 equal to or greater than that of the light conducting channel 50 overlies the channel 50. Light 54, from light source 56 would otherwise be totally internally reflected within channel 50. However, pressure applied to member 52 which (as seen) bows this member slightly into contact with channel 50 will couple the light 54 out of channel 50 and up into member 52 to be totally or substantially totally absorbed. A switch device can thus be produced or formed by this means.

A still further modification of the aforedescribed technique can be utilized to produce a 4-port coupler. Referring to FIG. 7 there is shown a substrate 58 with a plastic light conducting layer 60 forming a light conducting channel 62 thereon. A second flexible material 64 coated with a plastic forms a light conducting channel 66. Light 68 from light sources (not shown) at either end of channel 62 or 66 (identified herein AB ports 1, 2, 3 and 4) without more, will be totally internally reflected through each channel from one end to the other. Pressing the upper light conducting channel members 66 into contact with lower channel 62, (effectively bowing the upper into the lower) as shown, couples the light 68, for example, from port 1 (light source) up into member 66 to exit at port 4. Release of pressure against the upper member 66 causes this membrane to flex up away from member 62 decoupling the light from port 4 and permitting the light to exit at port 3 as before.

Devices such as the foregoing couplers find use in optical bus lines in which there is a common optical channel over which data is transmitted. When a peripheral instrument or apparatus (not shown) is "on" it is often desirable to be able to tap some of the power (light) out of the lines for detection (port 4 in the drawing figures) and to transmit data into this line (port 2). When the apparatus or instrument is "off" it is desirable that light pass from port 1 to port 3 unattenuated. The above described structural arrangement can perform this function.

What is claimed is:

1. The method of producing single plane optical membrane switch/keyboard apparatus comprising the steps of;
   providing a plastic substrate containing a monomer with a known index of refraction;
   selectively exposing said substrate to ultra-violet light through a pattern mask effectively photo-polymerizing said monomer and producing individual horizontal light guides in the exposed areas having an index of refraction higher than the original substrate prior to photo-polymerization;
   removing the unpolymerized monomer;
   rotating said mask;
   exposing said substrate to ultra-violet light through the mask photo-polymerizing said monomer and producting individual vertical light guides in the exposed areas;
   removing the unpolymerized monomer;
   the double exposure of the horizontal and vertical light guides at the points of intersection thereof produces a still higher index of refraction than either the initial substrate or the horizontal and vertical light guides;
   providing a light source for said light guides;
   providing a light detector for each of said light guides; and
   providing coupling means for coupling the light from the horizontal light guide into the vertical light guide so as to be detected in the vertical light guide.

2. The invention in accordance with claim 1 further including the step of providing an array of rows and columns of upstanding projections with a projection disposed adjacent to a respective horizontal and vertical light guide intersection.

3. The invention in accordance with claim 1 further including the step of applying a light absorbing member adjacent to each light guide intersection acting as a light attenuating element.

4. The invention in accordance with claim 1 further including the step of providing an indicia bearing key top for each coupling means.

5. A single plane optical membrane switch apparatus comprising;
   a substrate member having a known refractive index;
   a first plurality of light guides on said substrate providing horizontal rows of light conducting membrane channels;
   said first plurality of light guides having an index of refraction higher than said substrate;
   a second plurality of light guides on said substrate arranged at right angles thereto to provide vertical columns of light conducting membrane channels; and
   coupling means interconnecting said horizontal and said vertical light conducting membranes with the intersecting area between the two membranes being of a higher index of refraction than either of the horizontal and vertical membranes.

6. The invention in accordance with claim 5 further including a matrix of rows and columns of upstanding projections disposed adjacent to intersection of said horizontal and vertical membrane providing make and break switch means as the membranes are pressed onto said projections.

7. The invention in accordance with claim 5 further including light absorbing means disposed on each coupling member so as to absorb the light coupled thereinto.

* * * * *